(12) United States Patent
Zimlich et al.

(10) Patent No.: US 6,461,774 B1
(45) Date of Patent: *Oct. 8, 2002

(54) APPARATUS AND METHOD FOR FORMING FEATURES ON A SUBSTRATE

(75) Inventors: David A. Zimlich; David H. Wells, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/141,841

(22) Filed: Aug. 27, 1998

(51) Int. Cl.$^7$ ................................................. G03F 9/00
(52) U.S. Cl. ......................................................... 430/5
(58) Field of Search ........................... 430/5, 322, 323, 430/324

(56) References Cited

U.S. PATENT DOCUMENTS

| | | | |
|---|---|---|---|
| 5,194,344 A | | 3/1993 | Cathey, Jr. et al. ............. 430/5 |
| 5,194,346 A | | 3/1993 | Rolfson et al. ................. 430/5 |
| 5,308,741 A | | 5/1994 | Kemp ......................... 430/312 |
| 5,384,219 A | * | 12/1995 | Dao et al. ....................... 430/5 |
| 5,472,811 A | * | 12/1995 | Vasudev et al. ................ 430/5 |
| 5,766,829 A | | 6/1998 | Cathey, Jr. et al. ......... 430/394 |
| 5,851,704 A | * | 12/1998 | Pierrat ........................... 430/5 |
| 5,906,910 A | * | 5/1999 | Nguyen et al. ............. 430/311 |
| 5,908,718 A | * | 6/1999 | Ishida et al. ................ 430/311 |

OTHER PUBLICATIONS

Cathey, Jr., David A., "Field Emission Displays", in*IEEE International Symposium* on VLSI*Technology, Systems, and Applications*, Taipei, Taiwan, 1995, pp. 131–136.

Cathey, Jr., David A., "Field–Emission Displays", *Information Display*, 11(10):16–20, Oct. 1995.

Liu, Yong et al., "Systematic Design of Phase–Shifting Masks with Extended Depth of Focus and/or Shifted Focus Plane", in *IEEE Transactions on Semiconductor Manufacturing, vol.* 6(1):1–21, Feb. 1993.

Levenson, M. David, "Exxtending Optical Lithography to the Gigabit Era",*Microlithography World*, 3(4): 5–13, 1994.

Dammel, Ralph,*Diazonaphthoquinone–based Resists*, SPIE Optical Engineering Press, Bellingham, Washington, 1993, Chap. 7, pp. 162–188.

* cited by examiner

*Primary Examiner*—Mark F. Huff
*Assistant Examiner*—Saleha R. Mohamedulla
(74) *Attorney, Agent, or Firm*—Dorsey & Whitney LLP

(57) ABSTRACT

A phase-shifting lithographic mask, a method for its fabrication, and a method for its use in forming field-emission display emitters is described. The mask is made from a plate and has field and pattern regions that both transmit light of a given wavelength. The pattern region is a plurality of regularly spaced etched regions of the plate, with the optical path length of the pattern region differing from the optical path length of the field region by an odd integer multiple of one-half the light wavelength. Use of phase-shifting lithography improves depth-of-focus, and correspondingly relaxes planarity requirements. The pattern region of the mask is sized to expose a photoresist layer used in fabricating field-emission display emitters in just a single light exposure, thereby avoiding the disadvantages associated with conventional dual pass phase-shifting lithography.

29 Claims, 5 Drawing Sheets

$$d_1 - d_2 = \frac{m\lambda}{2(n-1)}$$

$$m = \pm 1, \pm 3, \pm 5 \ldots$$

APPARATUS AND METHOD FOR FORMING FEATURES ON A SUBSTRATE

STATEMENT OF GOVERNMENT INTEREST

This invention was made with government support under Contract No. DABT-63-93-C-0025 awarded by Advanced Research Projects Agency (ARPA). The government has certain rights in this invention.

TECHNICAL FIELD

The present invention relates generally to lithographic masks used for forming features on a substrate, and more particularly, to phase-shifting masks used for forming features on a semiconductor substrate.

BACKGROUND OF THE INVENTION

Fabricating microelectronic devices typically includes forming features on selected layers of a semiconductor wafer. Individual features are often formed by using a mask to protect selected portions of a layer of material during subsequent processing steps. Masks may be used in the fabrication of virtually any type of microelectronic device, and are particularly useful in the fabrication of field emission displays (FEDs), which may be used in computers, television sets, camcorder viewfinders, and a wide variety of other applications.

FEDs are one type of flat panel display. In an FED, a baseplate with a generally planar emitter substrate is positioned relatively parallel to a faceplate having a substantially transparent display screen. The baseplate has a number of emitters formed on the emitter substrate that project from the substrate towards the faceplate. The emitters are commonly of a roughly conical shape, with the tips projecting towards the faceplate. An extraction grid having holes aligned with respective emitters is positioned between the emitter substrate and the baseplate. In operation, a potential difference is applied to the extraction grid and the emitters, thereby causing the emitters to emit electrons. The inner surface of the display screen is coated with a transparent conductive material and a cathodoluminescent layer. A potential difference is applied to the emitters and the conductive material to attract the electrons emitted by the emitters to the display screen. As these electrons pass through the cathodoluminescent layer to the conductive material, the cathodoluminescent layer emits light. For a general overview of FED technology, see D. A. Cathey, Jr., "*Field Emission Displays,*" *Information Display* Vol. 11, No. 10, pages 16–20, October 1995, incorporated herein by reference.

Fabrication of the emitters can be done in accordance with a number of known processes. Typically, a plurality of regularly spaced areas are protected during anisotropic etching of the emitter substrate. These areas are are protected by a patterned protective layer, such as silicon-dioxide overlying a silicon emitter substrate. Patterning the protective layer is accomplished by use of a mask, such as a photolithographic mask or reticle used to selectively expose a photoresist layer overlying the protective layer. Alternatively, a mechanical mask can be employed, such as beads or other relatively uniformly sized particles that are distributed over the protective layer.

Currently available masks used to fabricate FED emitters suffer from a number of problems. Mechanically distributed beads often cluster or are otherwise not uniformly distributed, thereby producing irregularly shaped and irregularly distributed emitters. Traditional photolithographic transmission masks selectively pass or block light to form respectively light and shadow regions on the photoresist layer. Improved resolution is achieved at the expense of reduced depth-of-focus and process throughput. Given the dimensions of the emitters (approximately one-by-one micrometer in cross-section at the substrate), traditional photolithographic techniques have significant depth-of-focus problems, thereby requiring the use of a highly planar (and correspondingly expensive) emitter substrate.

SUMMARY OF THE INVENTION

In accordance with one aspect of the present invention, a mask is provided for forming a pattern on a surface of a substrate. The mask has a substantially planar surface and is adapted to transmit light of a predetermined wavelength. The mask includes a field portion adapted to transmit the light and provide a first optical path length. The mask also includes a pattern portion adapted to transmit the light and provide a second optical path length. The first and second optical path lengths differ by approximately an odd integer multiple of one-half the predetermined wavelength. The pattern portion of the mask includes a plurality of pattern elements, each of which is substantially laterally surrounded by a respective part of the field portion. Each of the pattern elements has substantially equal spatial extent along first and second lateral directions that are substantially perpendicular to one another.

In accordance with another aspect of the present invention, a method is provided for fabricating a lithographic mask of a type for use in semiconductor device manufacturing. The mask is made from material that transmits light of a predetermined wavelength that is incident upon the mask in a first direction. The method of fabricating the mask includes covering a surface of the mask material with a protective layer. A portion of the protective layer is selectively removed to expose a corresponding portion of the mask material and leaving a remaining portion of the protective layer. Either the remaining protective layer or the exposed mask material includes a plurality of pattern elements, each of substantially the same size and separated from other pattern elements by the exposed mask material or the remaining protective layer, respectively. Each pattern element has substantially equal spatial extent along second and third directions that are substantially mutually perpendicular with each other and with the first direction. A portion of the exposed mask material is then removed, with the amount removed corresponding to an optical path length of approximately an odd integer multiple of one-half the predetermined wavelength. The remaining portion of the protective layer is subsequently removed.

In accordance with a further aspect of the present invention, a method is provided for fabricating a periodic structure in a substrate having a substantially planar surface, such as forming a plurality of field-emission display emitters in a semiconductor substrate. A protective layer is formed overlying the substrate. The protective layer is then substantially continuously exposed to light for no more than a single exposure time interval. The light undergoes substantially destructive interference at a plurality of regions of the protective layer. Each of these regions has substantially equal spatial extent along first and second lateral directions that are substantially perpendicular to one another. Portions of the protective layer are removed to expose underlying portions of the substrate, and portions of the exposed substrate are then removed.

DETAILED DESCRIPTION OF THE INVENTION

The following is a description of embodiments of the present invention, and includes a discussion of particular lithographic masks, their fabrication, and their use to construct FED emitters. The description sets forth a variety of specific details in order to provide a thorough understanding of these embodiments of the present invention. Those skilled in the art will understand, however, that the present invention may be practiced without such details. In other instances, well-known mask features and associated fabrication process steps are not shown or described in detail in order to avoid unnecessarily obscuring the description of various embodiments of the invention.

Figure 1:
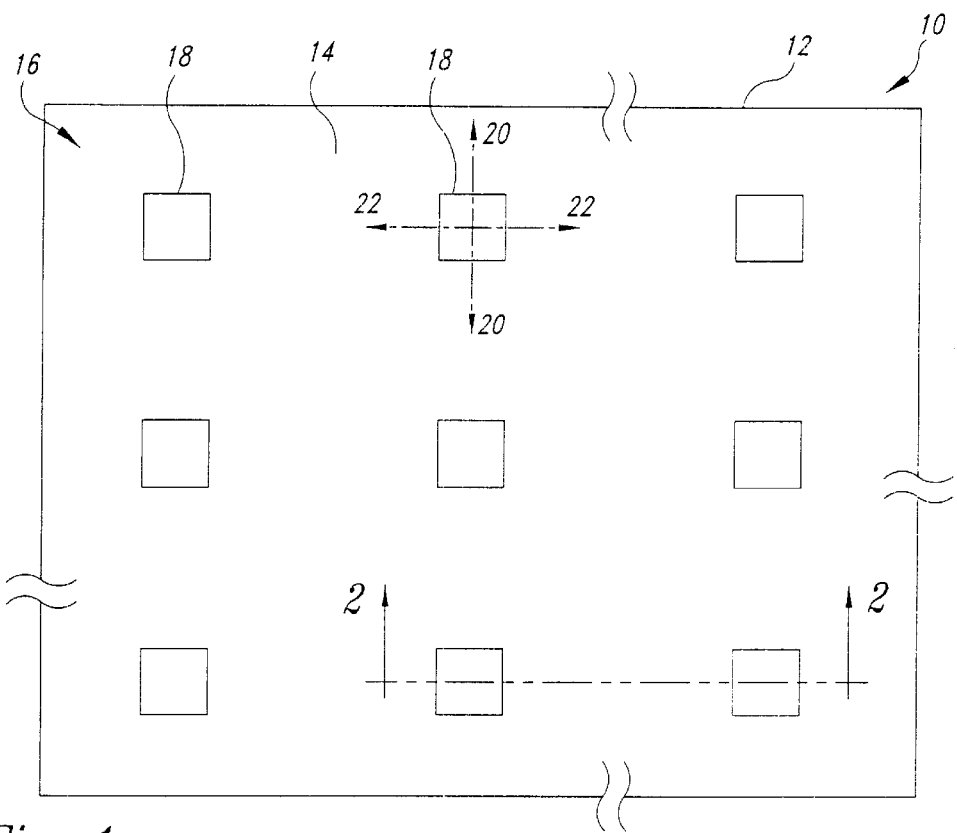
FIG. 1 is a top plan view depicting a mask in accordance with an embodiment of the present invention.

FIG. 1 illustrates a phase shifting mask or reticle 10. The mask is made from a translucent or transparent plate 12, which is preferably a quartz plate having a thickness of order 2–5 millimeters. Alternatively, other materials such as calcium fluoride, soda-lime glass, borosilicate glass, or other transparent materials may be used for the plate 12. The mask 10 includes a field region 14 of the plate 12 and a pattern region 16 of the plate. In the particular depiction of FIG. 1, the pattern region 16 includes a plurality of regularly spaced pattern elements 18, each of which is laterally surrounded by a corresponding portion of the field region 14. Each of the pattern elements 18 extends approximately the same amount in first and second mutually perpendicular lateral directions 20, 22 (i. e., directions taken approximately parallel to the planar surface of the plate 12 ). In the particular depiction of FIG. 1, each of the pattern elements has an approximately square cross-section taken parallel to the planar surface of the plate 12. In one embodiment of the present invention, the square cross-section measures approximately 2×2μm. Those skilled in the art will appreciate that other pattern element cross-sectional shapes and sizes may be useful, such as circular, elliptical, triangular, trapezoidal, and various generally polygonal shapes.

Light incident upon the mask 10 is transmitted through both the field region 14 and the pattern region 16. As will be described in detail below, the light passing through the pattern region 16 is phase shifted relative to the light passing through the field region 14. Consequently, light interference effects occur in the light once it has been transmitted through the mask 10. As is known to those skilled in the art, the phase shifting may be accomplished by any of a number of techniques. For example, the pattern region 16 may be etched, or otherwise selectively formed, so that each of the pattern elements 18 presents a thickness to the light that is less than the laterally surrounding portion of the field region 14. Alternatively, the field region 14 may be etched, or otherwise selectively formed, so that each of the pattern elements 18 presents a greater thickness to the transmitted light than the surrounding field region 14.

As an alternative to the field region 14 and pattern region 16 having different thickness, various other phase shifting materials may be used to form the desired pattern region and/or field region. Examples of appropriate phase shifting materials are oxides and nitrides, such as silicon dioxide, silicon nitride, tetraethylorthosilicate (TEOS) based oxides, borophosphosilicate-glass (BPSG), phosphosilicate-glass (PSG), borosilicate-glass (BSG), oxide-nitride-oxide (ONO), plasma enhanced silicon nitride, a spin-on glass (SOG), composite oxides and/or nitride materials, and/or similar dielectric materials. Such materials can be selectively formed as one or more layers overlying or otherwise integrated with the plate 12 by conventional and well-known deposition and etch techniques.

Figure 2:
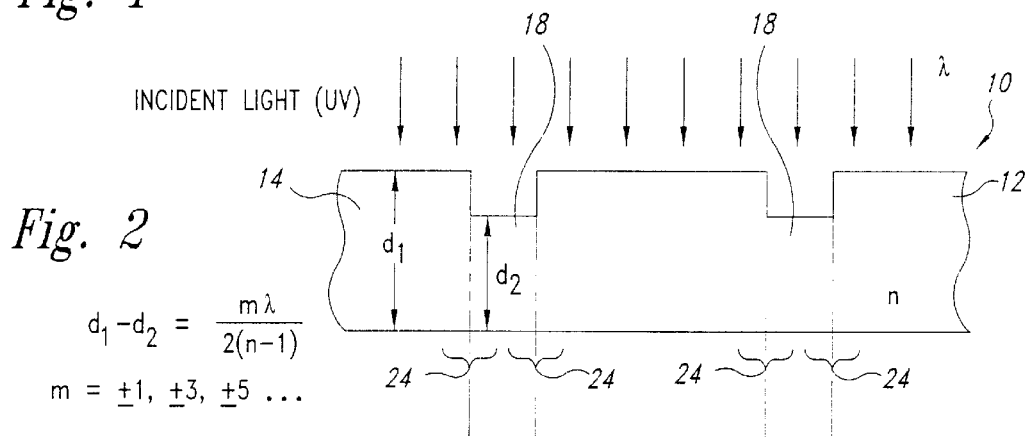
FIG. 2 is a cross-sectional view of a portion of the mask depicted in FIG. 1, and also depicts light incident on the mask.

FIG. 2 illustrates a cross-sectional view of the mask 10 of FIG. 1 through a line 2—2. In the particular depiction of FIG. 2, the pattern elements 18 are etched relative to the laterally surrounding field region 14. Each of the pattern elements 18 then presents a reduced optical path length to transmitted light relative to the optical path length provided by the field region 14. If the difference between these optical path lengths is an odd integer multiple of one-half the wavelength of the incident light, then destructive interference effects will occur in boundary regions 24 corresponding to the junction of the field and pattern regions of the mask. The conditions for such destructive interference effects can be conveniently represented by the equation $$d_1 - d_2 = \frac{m\lambda}{2(n-1)}, \quad m = \pm 1, \pm 3, \pm 5, \ldots,$$

where $d_1$ is the thickness of the field region 14, $d_2$ is the thickness of each of the pattern elements 18, $\lambda$ is the wavelength of light incident upon the mask 10, and n is the index of refraction of the material forming the plate 12.

Figure 3:
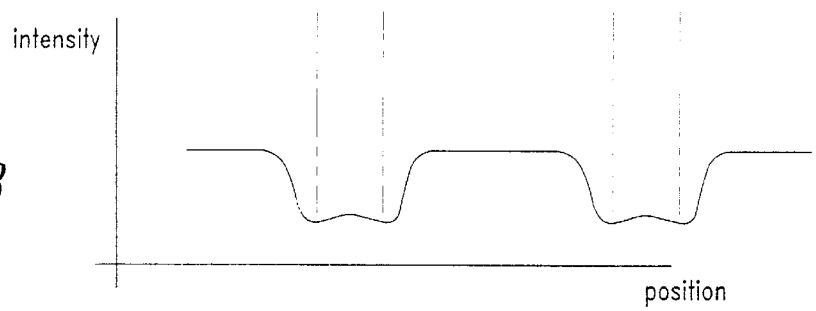
FIG. 3 is a graphical depiction of the intensity distribution of light transmitted by the portion of the mask depicted in FIG. 2.

Referring to FIG. 3, a graphical representation of the intensity of light transmitted through the mask 10 is shown as a function of position along the mask. FIG. 3 is juxtaposed relative to FIG. 2 to show the intensity distribution corresponding to the portion of the field region 14 and the pattern elements 18 depicted in FIG. 2. Destructive interference of light transmitted through the field region 14 and the pattern elements 18 is most pronounced in the boundary regions 24 corresponding to the junction of the field and pattern regions. Destructive interference effects do not occur to any significant extent in areas that are relatively distant from the boundary regions 24. However, by suitable choice of light wavelength and corresponding pattern element geometries, the intensity of transmitted light can be reduced below a selected threshold value for regions corresponding to the entire extent of each of the pattern elements 18, as shown in the graph of FIG. 3. For example, the intensity threshold value may be selected in correspondence with energy dosage discriminating levels of selected photoresist materials.

A suitable choice for incident light may be in the violet portion of the visible spectrum or in the near-ultraviolet, mid-ultraviolet, or deep-ultraviolet portions of the electromagnetic spectrum, with the size of the pattern elements 18 shown in FIG. 1 being squares of side length approximately 1–2μm. Those skilled in the art will appreciate that the term "light," as used herein, may mean any form of electromagnetic radiation, whether visible light, ultraviolet light, X-rays, or other form of transmittable energy capable of exhibiting interference effects. Also, those skilled in the art will appreciate that materials used to construct the mask 10 and the dimension and sizing of the pattern elements 18 may be correspondingly adjusted for the selected "light."

Figure 4:
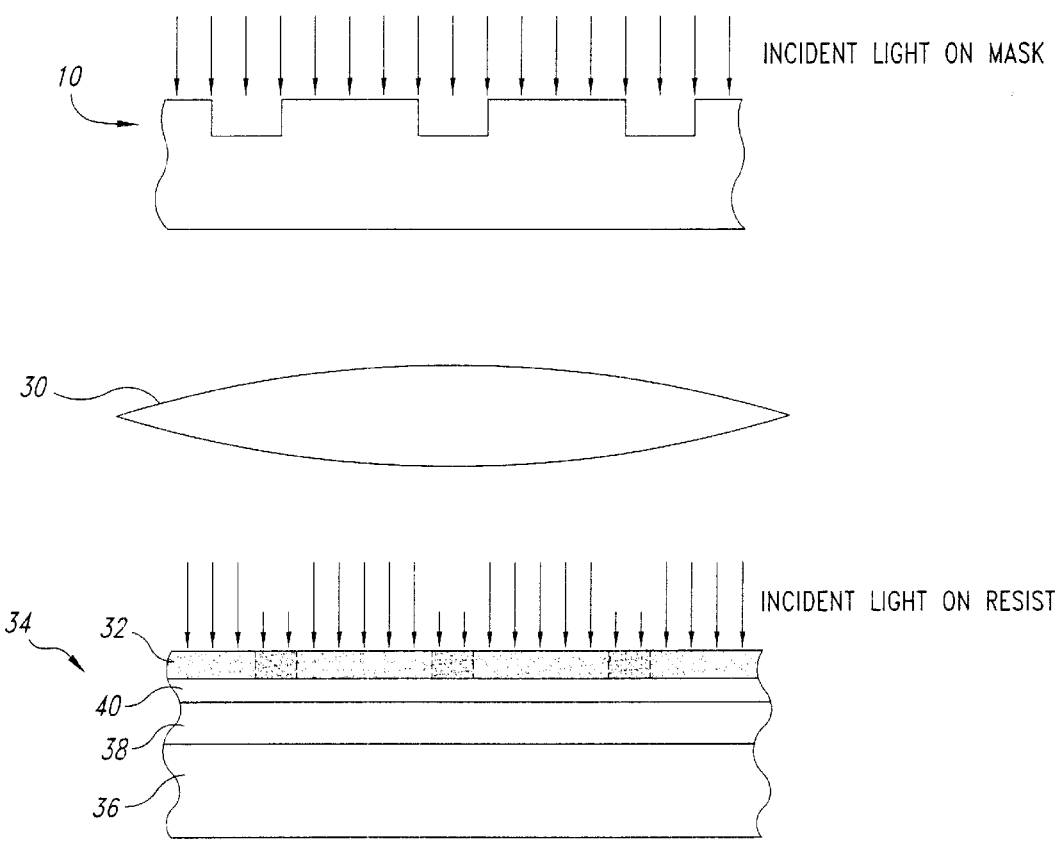
FIG. 4 is a part schematic, part cross-sectional view depicting a photolithographic exposure step used in the fabrication of an FED baseplate in accordance with an embodiment of the present invention.

FIG. 4 depicts a photolithographic processing step employed during fabrication of microelectronic circuitry, such as fabrication of emitters for an FED. Light is incident on a mask formed in accordance with an embodiment of the present invention, such as the mask 10 described above. Light transmitted through the mask is then focused by a lens 30 to produce a reduced scale of the above-described interference effects. The light focused by the lens 30 selectively exposes a photoresist layer 32 overlying a substrate on which features are to be produced.

One important advantage of the mask 10 is that it can be used in combination with existing photolithographic tools, while providing improved resolution and depth-of-focus relative to masks conventionally used with such tools.

FIG. 4 depicts a process commonly known as "projection" lithography. Those skilled in the art will understand that embodiments of the present invention may be employed in a wide variety of other lithographic processes, including "contact" and "proximity" photolithography. Also, those skilled in the art will appreciate that a mask constructed in accordance with an embodiment of the present invention may be used for patterning an entire substrate surface in a single scanning exposure, or may be used as a reticle in step-and-repeat lithographic tools commonly known as "steppers." In one embodiment of the present invention, a reticle is adapted for use in a 2×reduction stepper.

In the particular depiction of FIG. 4, a multi-layered configuration is shown of the type commonly used during fabrication of a baseplate 34 used in FEDs. The baseplate 34 typically includes a base layer 36, the emitter substrate layer 38, and a pattern protection layer 40. The base layer 36 may be made from a variety of materials, such as silicon, or preferably glass covered with a suitable conductive material such as metal. The emitter substrate layer 38 is preferably a semiconductor material, such as silicon. The pattern protection layer 40 is a material that resists etchants used to pattern the emitter substrate layer 38. If the emitter substrate layer 38 is silicon, the pattern protection layer 40 is then typically an oxide such as silicon dioxide. The photoresist layer 32 is exposed to the light transmitted by the mask 10 and lens 30. Those regions of the photoresist layer 32 that are subject to relatively high intensity light subsequently have different chemical properties than those regions of the photoresist layer 32 that are subject to relatively low intensity incident light.

Figure 5A:
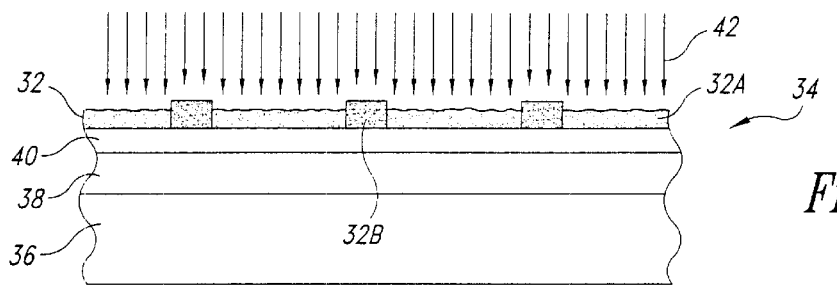
FIGS. 5A–5D depict subsequent processing steps during the fabrication of the FED baseplate.
Figure 5B:
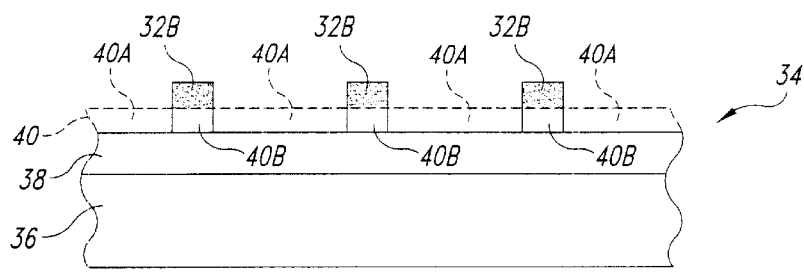

Referring to FIGS. 5A–5D, subsequent processing steps for fabrication of the FED baseplate 34 are shown. FIG. 5A illustrates selective removal of regions of the photoresist layer 32 by a developer solvent or anisotropic etchant 42. In this example, the photoresist layer 32 is of a "positive" photoresist composition, and those regions 32A of the photoresist layer 32 that were exposed to light having a relatively high intensity are removable by the etchant 42. Those regions 32B of the photoresist layer that were subject to a light having a relatively low intensity are unaffected by the etchant 42. The etchant 42 may itself be used to selectively remove regions 40A underlying the light-exposed photoresist regions 32A. Alternatively, and more typically, a separate anisotropic etching step may be performed to remove regions 40A. Regions 40B of the oxide layer 40 that underlie the regions 32B of the photoresist layer 32 are then protected, as shown in FIG. 5B.

Figure 5C:
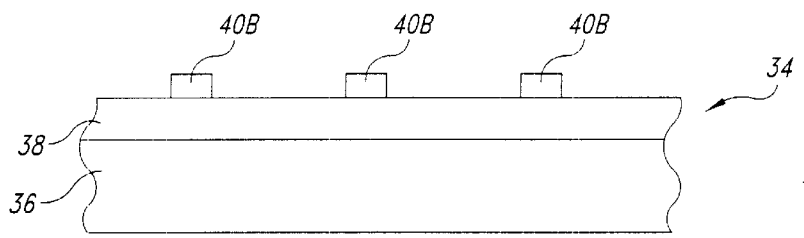
Figure 5D:
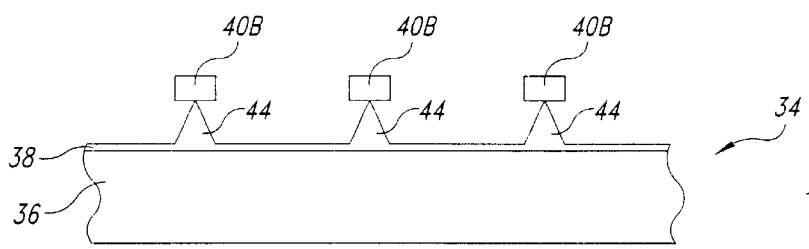

The remaining regions 32B of the photoresist layer 32 are then removed by mechanical or chemical means, leaving behind the "island-like" regions 40B of the oxide layer 40, as shown in FIG. 5C. In one embodiment of the present invention, each of these island regions 40B has a lateral linear dimension of approximately 1$\mu$m, with a separation distance between neighboring island regions of approximately 2–4$\mu$m. Features may then be formed from the emitter substrate layer 38 beneath the island regions 40B. For example, an isotropic etching process can create the features shown in FIG. 5D—namely, substantially conical emitters 44 beneath the island regions 40B. The regions 40B are then removed, such as by a suitable selective etching process. Those skilled in the art will appreciate that the described exemplary formation of FED emitters is just one of many features that may be formed in accordance with embodiments of the present invention.

Given the desired size and spacing of emitter tips in FEDs, traditional photolithographic techniques suffer from significant depth-of-focus problems, and the need for a high level of planarity in fabricated wafer structures is paramount. In contrast, embodiments of the present invention provide the advantage of improved depth-of-focus relative to traditional transmission photolithography, as is known by those skilled in the art. As such, the base layer 36 may be a relatively inexpensive glass plate in which the planarity of the plate is not a critical design element.

Phase shifting lithography has been used in certain applications to form sub-micron features in highly integrated circuits, but such applications have typically required multiple exposure and position shifting of masks in order to form desired feature sizes and shapes. For example, use of phase shifting masks and techniques is described in U.S. Pat. No. 5,308,741 to Kemp, incorporated herein by reference. Methods of fabricating phase shifting reticles or masks are described in U.S. Pat. No. 5,194,344 to Cathey et al., and in U.S. Pat. No. 5,194,346 to Rolfson et al., each of which is incorporated herein by reference. Because the chemical properties of photoresist materials do not change linearly with light energy exposure, multiple exposure photolithography is more difficult to control and has reduced tolerance, as known to those skilled in the art.

In contrast to currently employed phase shifting lithographic apparatus and techniques, embodiments of the present invention provide phase shifting masks and microelectronic fabrication techniques that require only a single light exposure—that is, the lithographic patterning process includes light exposure for no more than a single substantially continuous time interval. Those skilled in the art will appreciate the numerous advantages this provides, including improved lithographic process throughput time and volume, reduced feature geometry variations, improved lithographic energy exposure distribution, etc. Embodiments of the present invention are particularly suitable for use during fabrication of emitters in FEDs, given the geometry and sizing of such emitters.

Figure 6A:
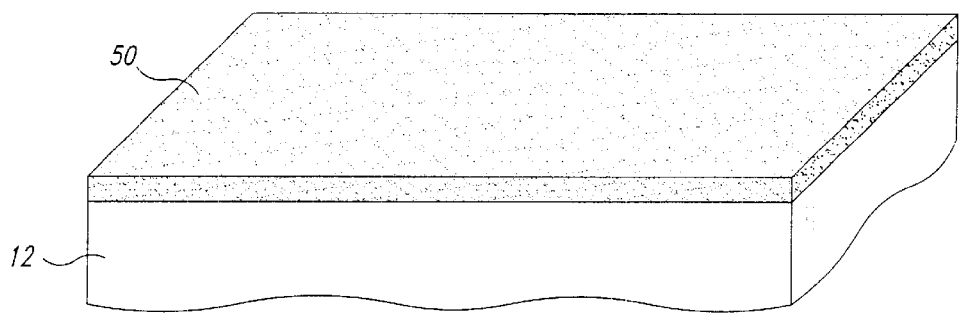
FIGS. 6A–6D depict process steps during fabrication of the mask shown in FIGS. 1 and 2.
Figure 6B:
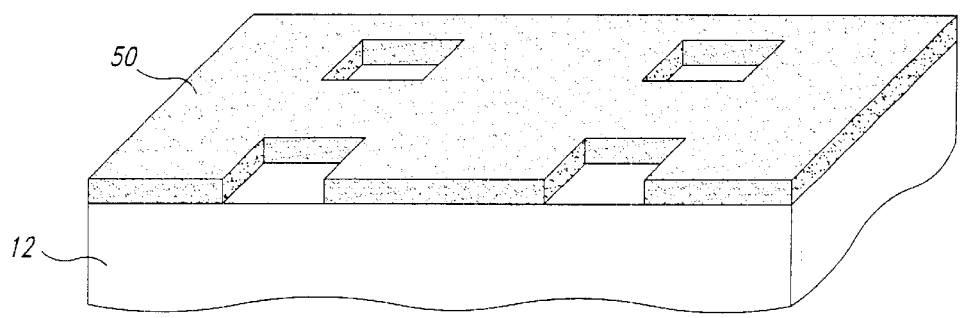

FIGS. 6A–6D illustrate one way of fabricating the mask 10 itself. The plate 12 is first covered with a protective coating or layer 50, such as chromium (chrome). Alternatively, an emulsion or iron-oxide layer could be used, among other suitable protective coatings. The chrome layer 50 is then covered with a resist layer or other suitable material (not shown) that may be patterned by any of a variety of selected exposure techniques, such as by electron-beam lithographic techniques. Selective removal of the resist occurs, followed by corresponding selective removal of the chrome layer 50 by any of a variety of conventional techniques, such as wet etch techniques. FIG. 6B shows the structure following selective removal of a portion of the chrome layer 50.

Figure 6C:
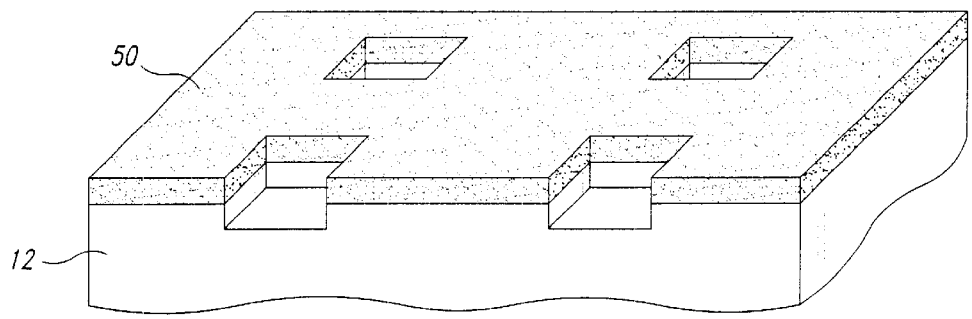
Figure 6D:
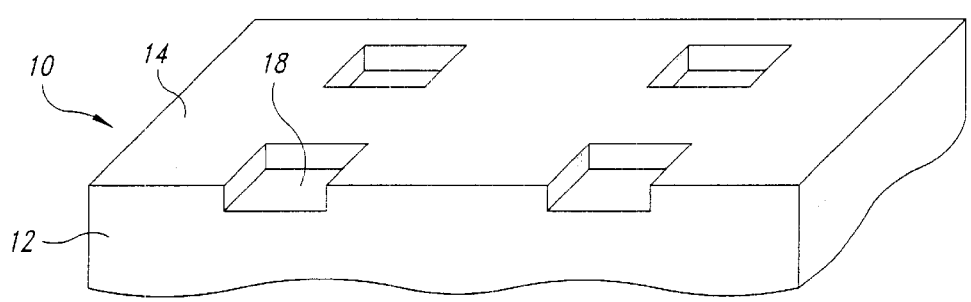

The patterned chrome layer 50 then functions as a protective mask for subsequent etching of the exposed region of the underlying plate 12. In the case of the preferred quartz plate 12, portions of the quartz are removed by one of a variety of suitably adapted anisotropic etching techniques, such as by plasma etching. FIG. 6C shows the plate 12 following the selective removal process. FIG. 6D then shows the resulting structure following removal of remaining portions of the chrome layer 50, which may be accomplished by any of a variety of suitable techniques, such as by employing a wet etching process. The resulting mask 10 then includes the field region 14 and pattern element 18 structure described above.

It will be appreciated that, while specific embodiments of the invention have been described for purposes of illustration, various modifications may be made without deviating from the spirit and scope of the invention. Accordingly, the invention is not limited by the disclosed embodiments, but instead the scope of the invention is determined by the following claims.

What is claimed is:

1. A mask for forming a pattern on a surface of a substrate, the mask being adapted to transmit light of a predetermined wavelength, the mask having a substantially planar surface and comprising:
    a field portion comprising a first thickness of a first transparent material adapted to transmit the light and providing a first optical path length; and
    a pattern portion adapted to transmit the light and providing a second optical path length that differs from the first optical path length by approximately an odd integer multiple of one-half the predetermined wavelength, the pattern portion including a plurality of pattern elements, each comprising a second thickness of a second transparent material and being substantially laterally surrounded by the field portion and having substantially equal spatial extent along first and second lateral directions, the first direction being substantially perpendicular to the second direction.

2. A mask according to claim 1 wherein the first transparent material comprises quartz.

3. A mask according to claim 1 wherein each of the pattern elements has a lateral linear dimension, and wherein each pattern element is spaced apart from adjacent pattern elements by a separation distance ranging between 2 and 4 times the lateral linear dimension.

4. A mask according to claim 1 wherein the first and second transparent materials are substantially the same material.

5. A mask according to claim 1 wherein the first optical path length is greater than the second optical path length.

6. A mask according to claim 1 wherein each of the pattern elements has a thickness that is substantially different from a thickness of the field portion.

7. A mask according to claim 1 wherein each of the pattern elements is of a shape having a substantially square cross-section taken parallel to the planar surface of the mask.

8. A mask for forming a pattern on a substrate, the mask adapted to transmit light of a predetermined wavelength incident on the mask in a first direction, the mask comprising:
    a field portion comprising a first transparent material having a first thickness along the first direction and being adapted to transmit the light and providing a first optical path length along the first direction; and
    a pattern portion adapted to transmit the light and providing a second optical path length along the first direction, the first and second optical path lengths differing by approximately an odd integer multiple of one-half the predetermined wavelength, the pattern portion including a plurality of pattern elements, each comprising a second transparent material having a second thickness along the first direction and being substantially the same size and separated from others of the pattern elements by the field portion, each of the pattern elements having substantially equal spatial extent along a second direction and a third direction, the first, second, and third directions being substantially mutually perpendicular.

9. A mask according to claim 8 wherein the second thickness along the first direction is less than the first thickness along the first direction.

10. A mask according to claim 8 wherein each of the pattern elements has a lateral linear dimension, and wherein each pattern element is spaced apart from adjacent pattern elements by a separation distance ranging between 2 and 4 times the lateral linear dimension.

11. A method of fabricating a mask adaptable for use in semiconductor device manufacturing, the mask adapted to transmit light of a predetermined wavelength and being fabricated from a plate having a substantially planar surface and first and second transparent regions, the method comprising:
    removing a portion of the plate in one of the first and second transparent regions, the difference between the thicknesses of the first and second transparent regions of the plate corresponding to an optical path length difference of approximately an odd integer multiple of one-half the predetermined wavelength;
    wherein one of the first and second transparent regions includes a plurality of pattern elements, each being substantially laterally surrounded by the other of the first and second transparent regions and having substantially equal spatial extent along first and second lateral directions, the first direction being substantially perpendicular to the second direction.

12. A method according to claim 11 wherein removing a portion of the plate comprises:
    covering the planar surface with a protective layer;
    selectively removing a portion of the protective layer to expose one of the first and second transparent regions, leaving a remaining portion of the protective layer overlying the other of the first and second transparent regions; and
    removing a portion of the exposed one of the first and second transparent regions.

13. A method according to claim 11 wherein the one of the first and second transparent regions in which a portion of the plate is removed comprises the one of the first and second transparent regions having the plurality of pattern elements, and wherein each of the pattern elements has a lateral linear dimension, and wherein each pattern element is spaced apart from adjacent pattern elements by a separation distance ranging between 2 and 4 times the lateral linear dimension.

14. A method of fabricating a mask adaptable for use in semiconductor device manufacturing, the mask being fabricated from a plate of transparent material adapted to transmit light of a predetermined wavelength and having a surface, the method comprising:
    covering the surface with a protective layer;
    selectively removing a portion of the protective layer to expose a corresponding portion of the plate of transparent material, leaving a remaining portion of the protective layer, wherein the exposed portion of the plate of transparent material and an unexposed portion of the plate of transparent material beneath the remaining portion of the protective layer form first and second transparent regions, respectively, and wherein one of the first and second transparent regions includes a plurality of pattern elements, each of substantially the same size and being separated from other pattern elements by the other of the first and second transparent regions, each of the pattern elements having substantially equal spatial extent along first and second directions taken substantially along the surface, the first diction being substantially perpendicular to the second direction;

removing a portion of the first transparent region such that a first thickness of the first transparent region of the plate of transparent material is less than a second thickness of the second transparent region of the plate of transparent material, the difference between the first and second thicknesses corresponding to an optical path length of approximately an odd integer multiple of one-half the predetermined wavelength; and removing the remaining portion of the protective layer.

15. A method according to claim 14 wherein each of the pattern elements has a lateral linear dimension, and wherein each pattern element is spaced apart from adjacent pattern elements by a separation distance ranging between 2 and 4 times the lateral linear dimension.

16. A method according to claim 14 wherein selectively removing a portion of the protective layer includes:

depositing a selectively soluble material on the protective layer;

selectively exposing the selectively soluble material to energy to form relatively soluble and insoluble regions thereof; and removing the soluble region with a solvent.

17. A method according to claim 16 wherein selectively exposing the selectively soluble material to energy includes directing an electron beam at the selectively soluble material.

18. A method according to claim 14 wherein selectively removing a portion of the protective layer includes selectively etching the protective layer.

19. A method according to claim 14 wherein removing a portion of the first transparent region includes plasma etching the first transparent region.

20. A mask for forming a pattern on a surface of a substrate, the mask being adapted to transmit light of a predetermined wavelength, the mask having a substantially planar surface and comprising:

a field portion comprising a first transparent material adapted to transit the light and providing a first optical path length; and a pattern portion adapted to transmit the light and providing a second optical path length that differs from the first optical path length by approximately an odd integer multiple of one-half the predetermined wavelength, the pattern portion including a plurality of pattern elements, each comprising a second transparent material and being substantially laterally surrounded by the field portion and having substantially equal spatial extent along first and second lateral directions, the first direction being substantially perpendicular to the second direction.

21. The mask according to claim 20 wherein the first transparent material comprises quartz.

22. The mask according to claim 20 wherein the second transparent material comprises quartz.

23. The mask according to claim 20 wherein each of the pattern elements has a lateral linear dimension, and wherein each pattern element is spaced apart from adjacent pattern elements by a separation distance ranging between 2 and 4 times the lateral linear dimension.

24. The mask according to claim 23 wherein the first transparent material has a first thickness and the second transparent material has a second thickness, and wherein the first thickness is equal to the second thickness.

25. A method of fabricating a mask adaptable for use in semiconductor device manufacturing, the mask adapted to transmit light of a predetermined wavelength and being fabricated from a transparent plate comprising a first transparent material having a first thickness, a first optical path length along a direction of the transmitted light, a substantially planar surface, and first and second transparent regions, the method comprising:

removing one of the first or second transparent regions;

in the place of the removed one of the first or second transparent regions, forming a portion of a second transparent material having a second thickness, the portion having a second optical path length along the direction of the transmitted light, the difference between the first and second optical path lengths being approximately an odd integer multiple of one-half the predetermined wavelength;

wherein one of the first or second transparent regions includes a plurality of pattern elements, each being substantially laterally surrounded by the other of the first and second transparent regions and having substantially equal spatial extent along first and second lateral directions, the first direction being substantially perpendicular to the second direction.

26. The method according to claim 25 wherein removing one of the first or second transparent regions comprises:

covering the planar surface with a protective layer;

selectively removing a portion of the protective layer to expose one of the first or second transparent regions, leaving a remaining portion of the protective layer overlying the other of the first or second transparent regions; and removing the exposed one of the first or second transparent regions.

27. The method according to claim 25 wherein the one of the first or second transparent regions which is removed is the one of the first or second transparent regions that does not have the plurality of pattern elements.

28. The method according to claim 25 wherein the first and second thicknesses are substantially equal.

29. The method according to claim 25 wherein each of the pattern elements has a lateral linear dimension, and wherein each pattern element is spaced apart from adjacent pattern elements by a separation distance ranging between 2 and 4 times the lateral linear dimension.

* * * * *